United States Patent
Kim et al.

(10) Patent No.: US 10,234,743 B2
(45) Date of Patent: Mar. 19, 2019

(54) BEAM STEERING DEVICE INCLUDING P-N JUNCTION LAYER

(71) Applicant: SAMSUNG ELECTRONICS CO., LTD., Suwon-si (KR)

(72) Inventors: Sunil Kim, Osan-si (KR); Jaechul Park, Yangju-si (KR); Duhyun Lee, Yongin-si (KR); Byounglyong Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/656,318

(22) Filed: Jul. 21, 2017

(65) Prior Publication Data
US 2018/0024412 A1  Jan. 25, 2018

(30) Foreign Application Priority Data
Jul. 21, 2016  (KR) ......................... 10-2016-0092894

(51) Int. Cl.
| | |
|---|---|
| *G02F 1/29* | (2006.01) |
| *G02F 1/00* | (2006.01) |
| *G02F 1/015* | (2006.01) |
| *B82Y 20/00* | (2011.01) |
| *H01L 31/0232* | (2014.01) |
| *H01L 31/103* | (2006.01) |

(52) U.S. Cl.
CPC ............ *G02F 1/292* (2013.01); *G02F 1/0018* (2013.01); *B82Y 20/00* (2013.01); *G02F 1/015* (2013.01); *G02F 1/29* (2013.01); *G02F 2202/10* (2013.01); *H01L 31/02327* (2013.01); *H01L 31/103* (2013.01)

(58) Field of Classification Search
CPC .......... G02F 1/0018; G02F 1/01; G02F 1/011; G02F 1/0126; G02F 1/01716; G02F 1/015; G02F 1/21; G02F 1/29; G02F 1/292; G02F 2001/0151; G02F 2201/34; G02F 2202/06; G02F 2202/10; G02F 2202/36; G02F 2203/02; G02F 2203/10; G02F 2203/11; G02F 2203/15; G02F 2203/24; G02B 5/008; G01S 7/481; G01S 17/02; B82Y 20/00; B82Y 30/00; H01L 27/144; H01L 27/1443; H01L 27/1461; H01L 27/14652; H01L 31/02327; H01L 31/09; H01L 31/103; H01L 31/105; H01L 31/118
USPC ...... 359/237, 244, 245, 256, 315; 385/1, 12; 977/932
See application file for complete search history.

(56) References Cited

U.S. PATENT DOCUMENTS

| | | | |
|---|---|---|---|
| 8,750,653 B1 * | 6/2014 | Peters | ................... G01J 5/0837 385/12 |
| 9,104,086 B1 | 8/2015 | Davids et al. | |
| 9,202,696 B2 | 12/2015 | Yang et al. | |
| 9,244,268 B2 * | 1/2016 | Long | ................ G02F 1/0126 |

(Continued)

*Primary Examiner* — Loha Ben
(74) *Attorney, Agent, or Firm* — Sughrue Mion, PLLC

(57) ABSTRACT

A beam steering device is provided including a p-n junction layer disposed on a reflective electrode layer, wherein a refractive index of the p-n junction layer is variable according to a voltage applied to the reflective electrode layer; a nanoantenna layer including a plurality of components disposed on the p-n junction layer; and a common electrode electrically connected to each of the plurality of components of the nanoantenna. The p-n junction layer may include a p-doped layer and an n-doped layer.

16 Claims, 4 Drawing Sheets

(56) References Cited

U.S. PATENT DOCUMENTS

| | | |
|---|---|---|
| 9,274,352 B2 * | 3/2016 | Long .................... G02F 1/0126 |
| 9,952,454 B2 * | 4/2018 | Long .................... G02F 1/0126 |
| 2014/0085693 A1 | 3/2014 | Mosallaei et al. |
| 2015/0355410 A1 | 12/2015 | Park et al. |
| 2016/0054596 A1 | 2/2016 | Lee et al. |
| 2017/0153527 A1 * | 6/2017 | Kim ......................... G02F 1/29 |
| 2018/0196137 A1 * | 7/2018 | Lee ......................... G01S 17/02 |

* cited by examiner

BEAM STEERING DEVICE INCLUDING P-N JUNCTION LAYER

CROSS-REFERENCE TO RELATED APPLICATION

This application claims priority from Korean Patent Application No. 10-2016-0092894, filed on Jul. 21, 2016, in the Korean Intellectual Property Office, the disclosure of which is incorporated herein in its entirety by reference.

BACKGROUND

1. Field

Apparatuses consistent with exemplary embodiments relate to a beam steering device including a p-n junction layer.

2. Description of the Related Art

Any of various methods are used for steering light, such as a laser beam, to a desired location. For example, a laser irradiation unit may be mechanically rotated, or optical phased arrays, such as a nanoantenna, and a waveguide may be used. When an optical phased array is used, optical characteristics of the nanoantenna or the waveguide may be electrically or thermally controlled and accordingly, a laser beam may be steered.

A motor or a microelectromechanical systems (MEMS) structure may be used for mechanical steering of the laser beam. An apparatus using a mechanical driver may be bulky and the price of thereof may be expensive. In addition, noise may be generated in the case of the motor and, when a MEMS structure is used, application areas may be limited due to issues such as vibration.

When an optical phased array is used for beam steering, drivers may be needed for respective pixel areas of the nanoantenna or for respective waveguides. Thus, an apparatus using such an optical phased array may be complex.

SUMMARY

One or more exemplary embodiments may provide a beam steering device using a p-n junction layer as an active layer for controlling optical characteristics of a pixel area of a nanoantenna.

Additional exemplary aspects and advantages will be set forth in part in the description which follows and, in part, will be apparent from the description, or may be learned by practice of the presented exemplary embodiments.

According to an aspect of an exemplary embodiment, a beam steering device may include: a reflective electrode layer; a p-n junction layer disposed on the reflective electrode layer, wherein a refractive index of the p-n junction layer is variable according to a voltage applied to the reflective electrode layer; a nanoantenna layer including a plurality of components disposed on the p-n junction layer; and a common electrode electrically connected to each of the plurality of components of the nanoantenna layer, wherein the p-n junction layer includes a p-doped layer and an n-doped layer which are sequentially stacked.

The p-doped layer may include p-type oxide semiconductor or p-silicon.

The p-doped layer may include nano-crystalline cuprous aluminate delafossite ($CuAlO_2$), nickel oxide (NiO), or copper oxide (CuO).

The n-doped layer may include Indium-Tin-Oxide (ITO), Indium-Zinc-Oxide (IZO), Ga—In—Zn-Oxide (GIZO), Al—Zn-Oxide (AZO), Ga—Zn-Oxide (GZO), and zinc oxide (ZnO).

The reflective electrode layer may include a plurality of reflective electrodes separated from each other and each of the plurality of reflective electrodes may correspond to one of a plurality of pixel areas.

The beam steering device may further include a driving circuit including a plurality of drivers, and the each of the plurality of drivers may apply a driving voltage to a corresponding one of the plurality of reflective electrodes.

The common electrode may be a wiring connected to each of the plurality of components of the nanoantenna layer.

The common electrode may be a transparent electrode layer disposed between the p-n junction layer and the nanoantenna layer.

The beam steering device may further include an intrinsic layer disposed between the p-doped layer and the n-doped layer, and the intrinsic layer may have doping density lower than a doping density of the p-doped layer and a doping density of the n-doped layer.

The beam steering device may further include an insulating layer disposed between the p-n junction layer and the nanoantenna layer. The insulating layer may have a thickness of about 10 nm to about 20 nm.

The common electrode may be a transparent electrode layer disposed between the p-n junction layer and the insulating layer, or disposed between the insulating layer and the nanoantenna layer.

Each of the plurality of components of the nanoantenna may have a circular shape, an elliptical shape or a polygonal shape when viewed from a plan view.

Each of the plurality of components of the nanoantenna layer may have a length shorter than a wavelength of a beam irradiated on the nanoantenna layer and gaps between adjacent ones of the plurality of components of the nanoantenna may be shorter than the wavelength.

The p-doped layer may be disposed directly on the reflective electrode layer.

BRIEF DESCRIPTION OF THE DRAWINGS

These and/or other exemplary aspects and advantages will become apparent and more readily appreciated from the following description of the exemplary embodiments, taken in conjunction with the accompanying drawings in which.

DETAILED DESCRIPTION

Figure 1:
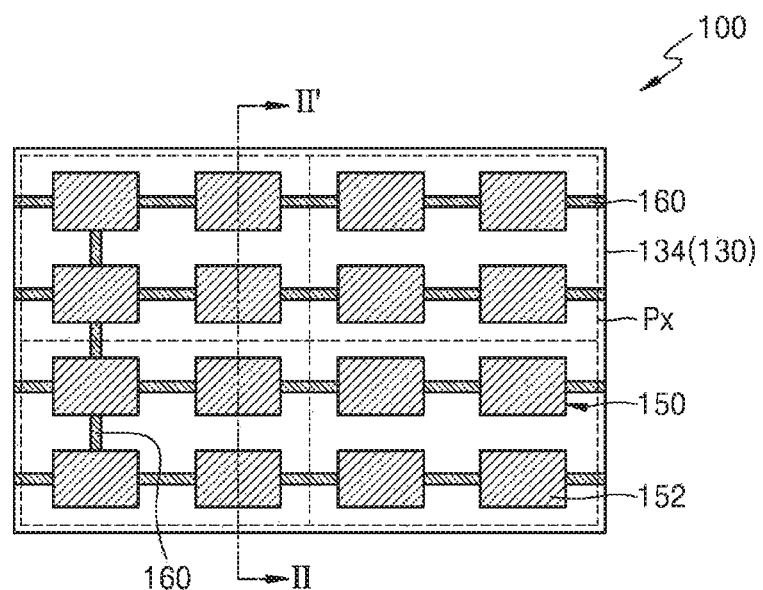
FIG. 1 is a plan view of a structure of a beam steering device including a p-n junction layer according to an exemplary embodiment.

Reference will now be made in detail to exemplary embodiments which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. Expressions such as "at least one of," when preceding a list of elements, modify the entire list of elements and do not modify the individual elements of the list.

Hereinafter, the exemplary embodiments will be described in detail with reference to the attached drawings. Like reference numerals in the drawings denote like elements. Sizes of components in the drawings may be exaggerated for convenience of explanation. In other words, since thicknesses of layers or areas in the drawings are arbitrarily illustrated for convenience of explanation, the following exemplary embodiments are not limited thereto.

In the case where a position relationship between two items is described with the terms "on ~" or "on the top of ~," one item may be not only directly on the other item while being in contact with the other item but may also be on the other item without being in contact with the other item.

FIG. 1 is a plan view of a structure of a beam steering device 100 including a p-n junction layer according to an exemplary embodiment.

Referring to FIG. 1, the beam steering device 100 may include a nanoantenna 150 formed on a p-n junction layer 130. The nanoantenna 150 may include a plurality of components 152. Each component 152 may have any of various shapes; for example, a rectangular shape, a circular shape, or a polygonal shape, in a plan view. Each component 152 may have dimensions on the order of a nanometer.

Each component 152 may have a diameter or a length shorter than a wavelength of light intended to be incident thereon. For example, the components 152 may each have a length of about ½ to about ⅓ of a wavelength of the light intended to be incident thereon. The incident light may be an infrared ray with a wavelength of about 1 μm to about 1.5 μm. Each of the components 152 may have a height of several tens of nanometers. A gap between adjacent ones of the components 152 may have a size of about ½ to about ⅓ of the wavelength of incident light.

The nanoantenna 150 may form a metasurface on a surface of the p-n junction layer 130.

Components 152 having rectangular shapes are illustrated in FIG. 1. The nanoantenna 150 may be formed in each of a plurality of pixel areas Px. Four pixel areas Px are illustrated in FIG. 1 for the sake of convenience, and four components 152 may be included in each pixel area Px. The components 152 may be electrically connected to each other. For example, the components 152 may be connected to each other via wiring 160 therebetween as illustrated in FIG. 1. The wiring 160 may extend in a first direction (a horizontal direction in FIG. 1) to connect the components 152 in a same row and may extend in a second direction (a vertical direction in FIG. 1) to connect components 152 in at least one column. A common voltage may be applied to the components 152 via the wiring 160. The wiring 160 may also be referred to as a common electrode.

Figure 2:
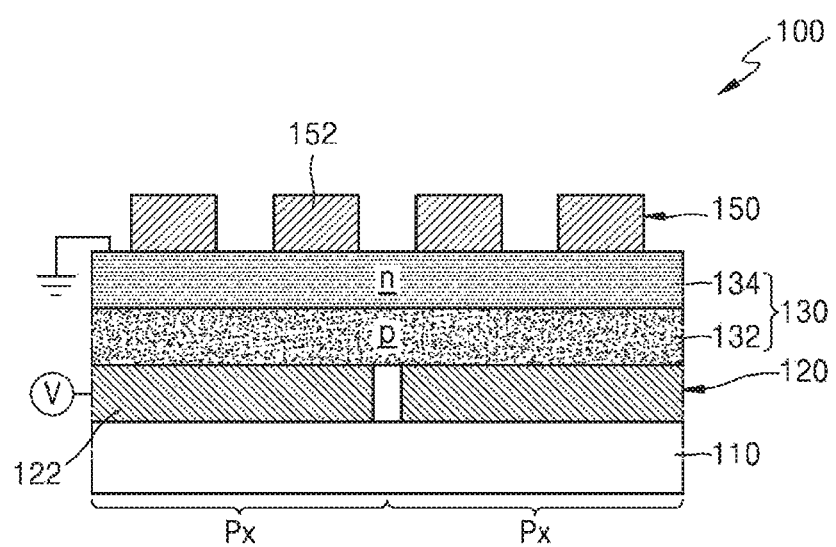
FIG. 2 is a cross-sectional view of FIG. 1, cut along a line II-II'.

FIG. 2 is a cross-sectional view of FIG. 1 taken along a line II-II'.

Referring to FIG. 2, a reflective electrode layer 120, the p-n junction layer 130, and the nanoantenna 150 may be sequentially stacked on a driving circuit 110. The p-n junction layer 130 may be a layer having a variable refractive index with respect to an applied voltage and may be referred to as an active layer.

The reflective electrode layer 120 may include a plurality of reflective electrodes 122. Each reflective electrode 122 may be formed in a corresponding pixel area Px and may transmit a voltage from the driving circuit 110 to the p-n junction layer 130 of the corresponding pixel area Px. One reflective electrode 122 may be formed in each pixel area Px. The reflective electrode 122 may reflect light incident thereon and may thereby increase a light extraction efficiency of the beam steering device 100.

The reflective electrode 122 may be formed with a thickness of about 50 nm to about 100 nm. The reflective electrode 122 may be formed of silver (Ag), gold (Au), aluminum (Al), or an alloy including at least one of Ag, Au, and Al, or titanium nitride (TiN), tantalum nitride (TaN), or the like.

The p-n junction layer 130 may include a p-doped layer 132 and an n-doped layer 134 which are sequentially stacked on the reflective electrode layer 120. The p-doped layer 132 may be formed of p-type oxide semiconductor, for example, cuprous aluminate delafossite ($CuAlO_2$), nickel oxide (NiO), copper oxide (CuO), or the like. In addition, the p-doped layer 132 may be formed of p-silicon. The p-doped layer 132 may be formed with a thickness of about 10 nm to about 50 nm. The p-doped layer 132 may include impurities with a density of about $10^{18}$ to about $10^{21}$ atoms/cm$^3$.

However, this exemplary embodiment is not limited thereto. For example, the n-doped layer 134 may be formed on the reflective electrode layer 120 and the p-doped layer 132 may be formed on the n-doped layer 134.

The n-doped layer 134 may include n-type semiconductor, for example, Indium-Tin-Oxide (ITO), Indium-Zinc-Oxide (IZO), Ga—In—Zn-Oxide (GIZO), Al—Zn-Oxide (AZO), Ga—Zn-Oxide (GZO), or Zinc oxide (ZnO). The n-doped layer 134 may be formed with a thickness of about 10 nm to about 50 nm. The n-doped layer 134 may include impurities with a density of about $10^{18}$ to about $10^{21}$ atoms/cm$^3$.

The components 152 of the nanoantenna 150 may be formed of Ag, Au, Al, or alloys including at least one of Ag, Au, and Al. The components 152 of the nanoantenna 150 may be formed of the same material as that of the reflective electrode 122. The components 152 may be arranged in an array in each pixel area Px. The components 152 may have the same size and the same shape as each other, though this exemplary embodiment is not limited thereto. For example, the components 152 may have different sizes and different shapes from each other.

The wiring 160 may be formed by coating the same material as that of the components 152 of the nanoantenna 150 on the n-doped layer 134 and by patterning thereafter.

A common voltage may be applied to the components 152. For example, a ground voltage or a minus voltage may be applied thereto via the wirings 160. The ground voltage is illustrated as being applied to the n-doped layer 134 in FIG. 2 for the sake of convenience.

A positive voltage may be applied to the reflective electrode 122. The driving circuit 110 may include drivers which apply driving voltages to the reflective electrode 122 in a corresponding pixel area Px. Each driver may include one transistor and one capacitor. When the ground voltage is applied to the wiring 160 and the transistor of the corresponding driver in a particular pixel area Px is addressed, a voltage, which has previously been stored in the capacitor, may be applied to the p-doped layer 132 in the corresponding pixel area Px. Then, a carrier density in a junction area of the p-n junction layer 130 in the pixel area Px may be changed and accordingly, a refractive index of the pixel area Px may be changed. Then, a phase and a refractive index of a reflected beam of the laser beam incident on the nanoantenna 150 may be controlled depending on the refractive index of the pixel area Px. In other words, the laser beam may be steered to a desired location.

The beam steering device 100 with features described above may be used in a depth sensor, a three-dimensional sensor, a light detection and ranging LiDAR (laser radar), or other device.

Figure 3:
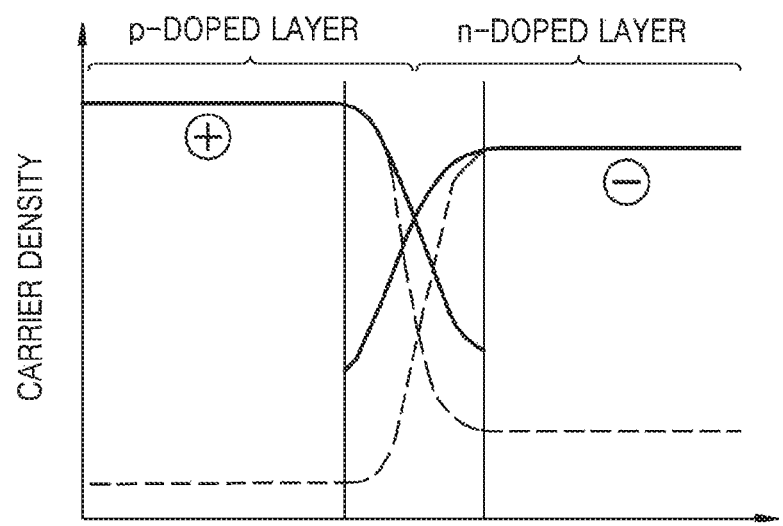
FIG. 3 is a graph illustrating an operation of the beam steering device according to an exemplary embodiment.
Figure 4:
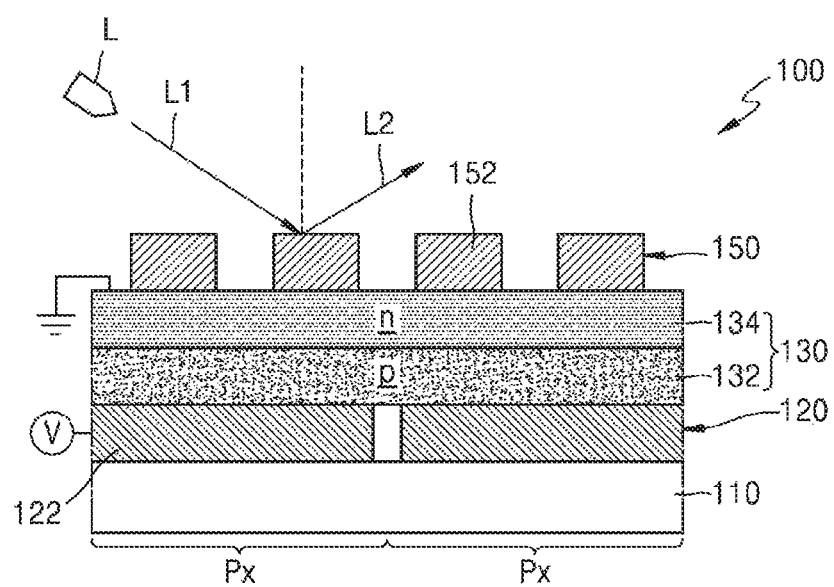
FIG. 4 is a diagram showing operations of the beam steering device according to an exemplary embodiment.

FIG. 3 is a graph illustrating an operation of the beam steering device according to an exemplary embodiment, and FIG. 4 is a diagram illustrating an operation of the beam steering device according to an exemplary embodiment.

The operation of the beam steering device according to an exemplary embodiment will be described with reference to FIGS. 3 and 4.

Firstly, the common voltage may be applied to the wiring 160. The common voltage may be the ground voltage. The driving voltage may be applied to each reflective electrode 122 via the driving circuit 110. The driving voltage may be the positive voltage.

In FIG. 3, dashed lines denote the carrier density before applying the driving voltage and solid lines denote the carrier density at the time of application of the driving voltage. The carrier density in the intermediate area of p-n junction layer 130 in each pixel area Px may change depending on the application of the driving voltage. The refractive index in the corresponding pixel area Px may change depending on the carrier density.

The laser beam may be irradiated onto the nanoantenna from a laser L. Incident Light L1 on the nanoantenna 150 may be reflected from the nanoantenna 150 and emitted after being refracted depending on the refractive index of the p-n junction layer 130 in the corresponding pixel area. An angle of reflection of emitted light L2 may be controlled via the refractive index of the p-n junction layer 130 in the corresponding pixel area.

According to an exemplary embodiment, the beam steering device 100 may control the refractive index, that is, an optical characteristic, of the components 152 of the nanoantenna 150 by applying a voltage to the p-n junction layer 130. Thus, controlling the refractive index of the components 152 may be easy, a manufacturing process of the driving components in respective pixel areas may be simplified, and a manufacturing cost of the beam steering device 100 may be decreased.

Figure 5:
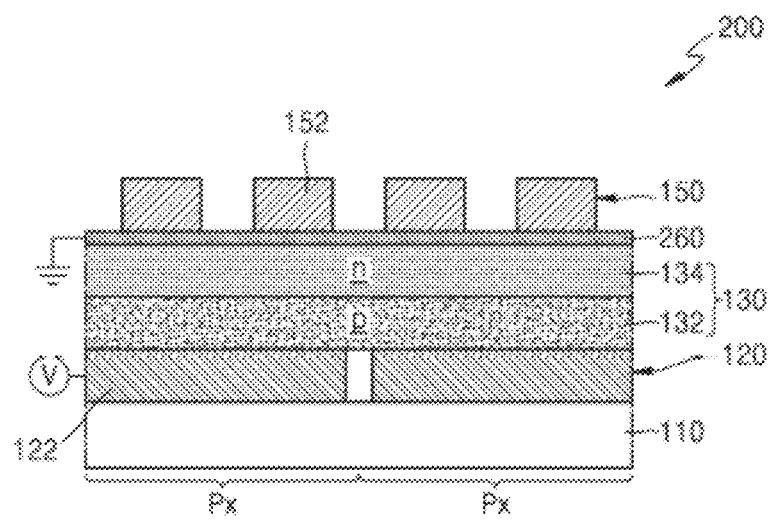
FIG. 5 is a cross-sectional view of a structure of a beam steering device including a p-n junction layer according to an exemplary embodiment.

FIG. 5 is a cross-sectional view of a structure of a beam steering device 200 including a p-n junction layer according to an exemplary embodiment. Elements which are essentially the same as those of the beam steering device 100 of FIGS. 1 and 2 will be given like reference numbers and detailed descriptions thereof will be omitted.

Referring to FIG. 5, instead of the wiring of the beam steering device 100, the beam steering device 200 may further include a transparent electrode layer 260 between the nanoantenna 150 and the n-doped layer 134. The transparent electrode layer 260 may serve as the common electrode of the components 152 of the nanoantenna 150 formed thereon.

The transparent electrode layer 260 may be formed of a transparent oxide semiconductor, for example, ITO.

Forming the transparent electrode layer 260, instead of the wiring 160, as the common electrode may make a manufacturing process easier.

An operation method of the beam steering device 200 of FIG. 5 may be understood from the operation method of the beam steering device 100 of FIG. 2, and descriptions thereof will be omitted.

Figure 6:
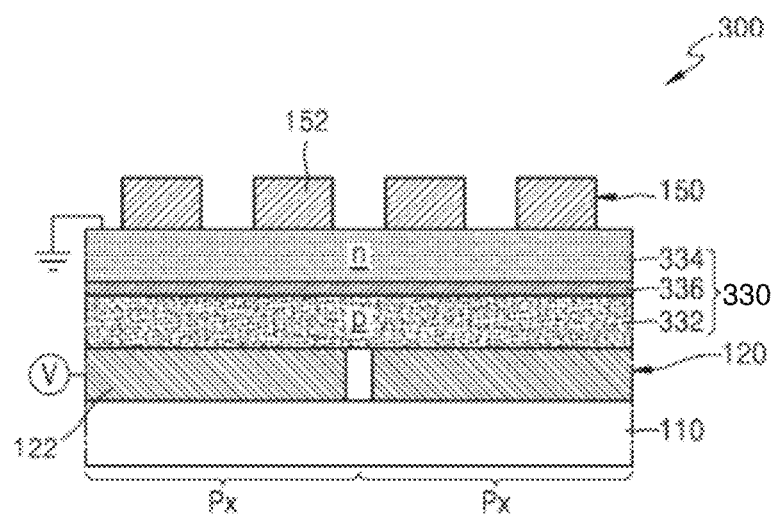
FIG. 6 is a cross-sectional view of a structure of a beam steering device including a p-n junction layer according to an exemplary embodiment.

FIG. 6 is a cross-sectional view of a structure of a beam steering device 300 including a p-n junction layer according to an exemplary embodiment. Elements which are essentially the same as those of the beam steering device 100 of FIGS. 1 and 2 are be given like reference numbers and detailed descriptions thereof are omitted.

Referring to FIG. 6, a p-n junction layer 330 of the beam steering device 300 may further include an intrinsic layer 336, having a comparatively low doping density, between a p-doped layer 332 and an n-doped layer 334. For example, doping densities of the p-doped layer 332 and the n-doped layer 334 may be approximately about $10^{18}$ to about $10^{21}$ atoms/cm$^3$, while the doping density of the intrinsic layer 336 may be approximately about $10^{15}$ to about $10^{17}$ atoms/cm$^3$. In other words, an active layer of the device may be a p-i-n layer. The intrinsic layer 336 may be formed of the same material as that of the p-doped layer 332 or the n-doped layer 334. When the intrinsic layer 336 is formed of the same material as that of the p-doped layer 332, the intrinsic layer 336 may be doped with p-type impurities. When the intrinsic layer 336 is formed of the same material as that of the n-doped layer 334, the intrinsic layer 336 may be doped with n-type impurities. The intrinsic layer 336 may have a thickness less than a thickness of the p-doped layer 332 and the n-doped layer 334. For example, the intrinsic layer 336 may have a thickness of several tens of nanometers to several tens of nanometers.

A break-down voltage of the beam steering device 300 including the intrinsic layer 336 may increase and accordingly, the carrier density may increase and thus, a change in the refractive index may increase.

In FIG. 6, the components 152 of the nanoantenna 150 are connected to each other via the wiring 160 (refer to FIG. 1). However, this exemplary embodiment is not limited thereto. For example, instead of the wiring 160, a transparent electrode layer (refer to reference number 260 in FIG. 5) may be formed between the n-doped layer 334 and the nanoantenna 150.

Figure 7:
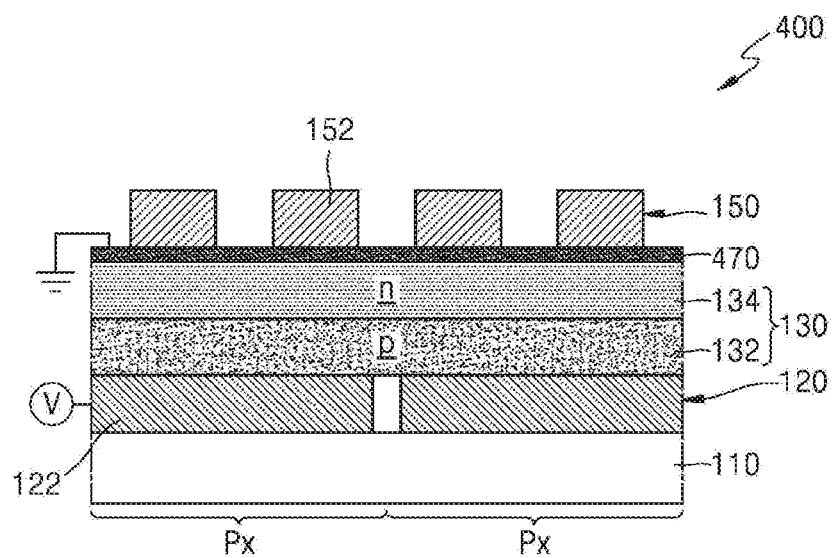
FIG. 7 is a cross-sectional view of a structure of a beam steering device including a p-n junction layer according to an exemplary embodiment.

FIG. 7 is a cross-sectional view of a structure of a beam steering device 400 including a p-n junction layer according to an exemplary embodiment. Elements which are essentially the same as those of the beam steering device 100 of FIGS. 1 and 2 are given like reference numbers and detailed descriptions thereof are omitted.

Referring to FIG. 7, an insulating layer 470 may be disposed on the p-n junction layer 130, and the nanoantenna 150 may be disposed on the insulating layer 470. The insulating layer 470 may be formed of silicon oxide, silicon nitride, or high dielectric constant materials such as hafnium oxide and aluminum oxide. The insulating layer 470 may have a thickness of about 10 nm to about 20 nm. When the insulating layer 470 is formed with a thickness smaller than about 10 nm, the insulating layer 470 may not completely cover the n-doped layer 134. When the insulating layer 470 is formed with a thickness larger than about 20 nm, a variable efficiency of the refractive index may be reduced.

The beam steering device 100 without an insulating layer may not easily perform the steering in a forming direction of the wiring 160 (the horizontal direction in FIG. 1); however, the beam steering device 400 including the insulating layer 470 may easily perform the steering in any desired direction regardless of the forming direction of the wiring 160 due to the existence of the insulating layer 470.

Figure 8:
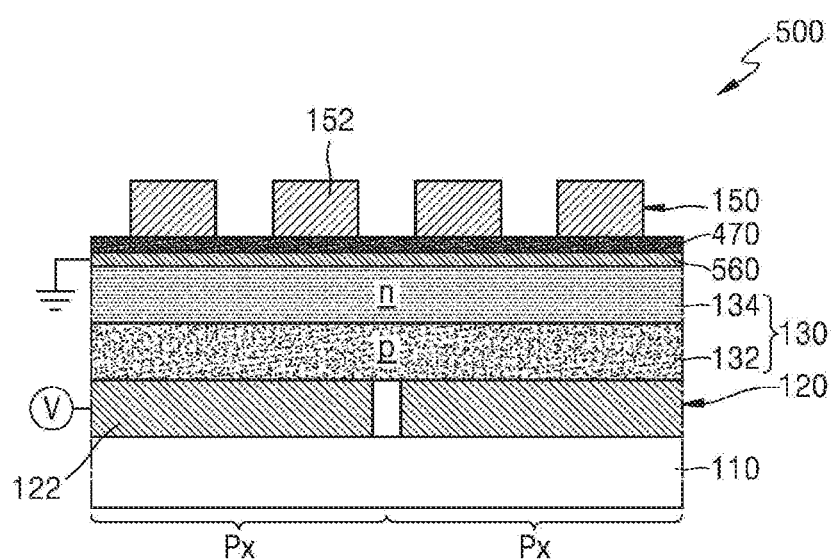
FIG. 8 is a cross-sectional view of a structure of a beam steering device including a p-n junction layer according to an exemplary embodiment.

FIG. 8 is a cross-sectional view of a structure of a beam steering device 500 including a p-n junction layer according to an exemplary embodiment. Elements which are essentially the same as those of the beam steering device 400 of FIG. 7 are given like reference numbers and detailed descriptions thereof are omitted.

The beam steering device 500 may include a transparent electrode layer 560 instead of the wiring 160, when compared with the beam steering device 400 of FIG. 7. The transparent electrode layer 560 may be arranged between the insulating layer 470 and the p-n junction layer 130. However, the exemplary embodiment is not limited thereto. For example, the transparent electrode layer 560 may be arranged between the insulating layer 470 and the nanoantenna 150.

The driving method of the beam steering device 500 may be well understood from the exemplary embodiments described above, and detailed descriptions thereof will be omitted.

According to an exemplary embodiment, the beam steering device may control the refractive index of the pixel areas with the nanoantenna thereon by applying a voltage to the p-n junction layer 130. Thus, controlling the refractive index of the pixel areas may be easy.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that any of various changes in form and details may be made therein without departing from the spirit and scope as defined by the following claims.

What is claimed is:

1. A beam steering device, the device comprising:
a reflective electrode layer;
a p-n junction layer disposed on the reflective electrode layer, wherein a refractive index of the p-n junction layer is variable according to a voltage applied to the reflective electrode layer;
a nanoantenna layer, disposed on the p-n junction layer, wherein the nanoantenna layer comprises a plurality of components; and
a common electrode electrically connected to each of the plurality of components of the nanoantenna layer,
wherein the p-n junction layer comprises a p-doped layer and an n-doped layer.

2. The device of claim 1, wherein the p-doped layer comprises one of a p-type oxide semiconductor and p-silicon.

3. The device of claim 2, wherein the p-doped layer comprises at least one of nanocrystalline cuprous aluminate delafossite ($CuAlO_2$), nickel oxide (NiO), and copper oxide (CuO).

4. The device of claim 1, wherein the n-doped layer comprises at least one of Indium-Tin-Oxide (ITO), Indium-Zinc-Oxide (IZO), Ga—In—Zn-Oxide (GIZO), Al—Zn-Oxide (AZO), Ga—Zn-Oxide (GZO), and zinc oxide (ZnO).

5. The device of claim 1, wherein the reflective electrode layer comprises a plurality of reflective electrodes separated from each other, wherein each of the plurality of reflective electrodes corresponds to a respective one of a plurality of pixel areas.

6. The device of claim 5, further comprising a driving circuit comprising a plurality of drivers, wherein each of the plurality of drivers applies a driving voltage to a corresponding one of the plurality of reflective electrodes.

7. The device of claim 6, wherein each of the plurality of reflective electrodes and each of the plurality of components of the nanoantenna layer comprise at least one of silver (Ag), gold (Au), aluminum (Al), an alloy comprising Ag, Au, or Al, titanium nitride (TiN), and tantalum nitride (TaN).

8. The device of claim 1, wherein the common electrode is a wiring connected to each of the plurality of components.

9. The device of claim 1, wherein the common electrode is a transparent electrode layer disposed between the p-n junction layer and the nanoantenna layer.

10. The device of claim 1, further comprising an intrinsic layer disposed between the p-doped layer and the n-doped layer, wherein a doping density of the intrinsic layer is lower than a doping density of the p-doped layer and a doping density of the n-doped layer.

11. The device of claim 1, further comprising an insulating layer disposed between the p-n junction layer and the nanoantenna layer.

12. The device of claim 11, wherein the insulating layer has a thickness of about 10 nm to about 20 nm.

13. The device of claim 11, wherein the common electrode is a transparent electrode layer disposed between the p-n junction layer and the insulating layer or disposed between the insulating layer and the nanoantenna layer.

14. The device of claim 1, wherein each of the plurality of components of the nanoantenna layer has one of a circular shape, an elliptical shape, and a polygonal shape when viewed from a plan view.

15. The device of claim 1, wherein each of the plurality of components of the nanoantenna layer has a length shorter than a wavelength of a beam irradiated on the nanoantenna layer, and wherein a gap between adjacent ones of the plurality of components of the nanoantenna layer is shorter than the wavelength.

16. The device of claim 1, wherein the p-doped layer is disposed directly on the reflective electrode layer.

* * * * *